(12) United States Patent
Ikeda et al.

(10) Patent No.: US 8,334,040 B2
(45) Date of Patent: Dec. 18, 2012

(54) ELECTROMAGNETIC WAVE SUPPRESSION MATERIAL AND ELECTROMAGNETIC WAVE SUPPRESSION SHEET

(75) Inventors: Yoshito Ikeda, Tochigi (JP); Norikazu Yamamoto, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 473 days.

(21) Appl. No.: 12/597,822

(22) PCT Filed: Dec. 2, 2008

(86) PCT No.: PCT/JP2008/071861
§ 371 (c)(1),
(2), (4) Date: Oct. 27, 2009

(87) PCT Pub. No.: WO2009/125517
PCT Pub. Date: Oct. 15, 2009

(65) Prior Publication Data
US 2010/0119814 A1     May 13, 2010

(30) Foreign Application Priority Data
Apr. 9, 2008    (JP) ................................. 2008-101951

(51) Int. Cl.
*H05K 9/00*      (2006.01)
*G21F 1/10*      (2006.01)
*B32B 1/06*      (2006.01)
*C08L 33/26*    (2006.01)

(52) U.S. Cl. ...................... 428/76; 399/1; 428/68; 430/7
(58) Field of Classification Search .................. 428/76, 428/68; 399/1; 430/7
See application file for complete search history.

(56) References Cited

U.S. PATENT DOCUMENTS
6,268,092 B1 * 7/2001 Akashi et al. ..................... 430/7
2006/0045543 A1 * 3/2006 Kato et al. ......................... 399/1

FOREIGN PATENT DOCUMENTS
JP    2006-73991 A    3/2006
JP    2006-319048 A   11/2006
JP    2007-27470 A    2/2007

OTHER PUBLICATIONS
International Search Report w/translation from PCT/JP2008/071861 dated Jan. 27, 2009 (2 pages).

* cited by examiner

*Primary Examiner* — Brent O'Hern
(74) *Attorney, Agent, or Firm* — Osha Liang LLP

(57) ABSTRACT

An electromagnetic wave suppression material that has a high light transmission performance even under a low temperature environment to display a sufficient electromagnetic wave suppression effect, and an electromagnetic wave suppression sheet that has the electromagnetic wave suppression material sealed in it, are disclosed. An electromagnetic wave suppression sheet (3) is composed of an electromagnetic wave suppression material (1) charged into a moisture-resistant film (2) whose peripheral part is laminated by a predetermined adhesive by way of sealing.

15 Claims, 8 Drawing Sheets

ELECTROMAGNETIC WAVE SUPPRESSION MATERIAL AND ELECTROMAGNETIC WAVE SUPPRESSION SHEET

TECHNICAL FIELD

This invention relates to an electromagnetic wave suppression material that suppresses unnecessary radiations of an electromagnetic wave from e.g. an electronic device, and to an electromagnetic wave suppression sheet in which has been sealed the electromagnetic wave suppression material.

The present application is a National Stage Application of PCT Application No. PCT/JP2008/071861 filed on Dec. 2, 2008, which claims priority rights based on the Japanese Patent Application 2008-101951, filed in Japan on Apr. 9, 2008. The total disclosure of the Patent Application of the senior filing date is to be incorporated herein by reference.

BACKGROUND ART

In these years, unnecessary radiations of an electromagnetic wave from an electronic device are becoming of a problem. In particular, in keeping pace with increase in the use of a high-frequency electromagnetic wave, damages or impediments, such as malfunctions of a device or adverse effects to the brain or human bodies by an electro-magnetic noise (interferences), are being presented as new environmental problems.

To deal with these problems of EMI (Electromagnetic Interferences), it has become necessary to sufficiently diminish or prevent those undesirable reciprocal effects between an electronic device and another device. This may be made possible by suppressing radiations of an unnecessary electromagnetic wave from an individual electronic device that might obstruct regular operations of another device, or by increasing the resistant power of such another device against an electromagnetic wave emanating from the individual electronic device.

The operating principle of an electromagnetic wave suppressor having the electromagnetic wave absorbing capability, referred to below simply as the electromagnetic wave suppressor, is that the major portion of the energy of the incident electromagnetic wave is to be converted into the thermal energy within the interior of the electromagnetic wave suppressor. Thus, with the electromagnetic wave suppressor, it is possible to diminish both the energy penetrated towards its front side and the energy reflected towards its rear side.

The loss that occurs in converting the electromagnetic wave into the thermal energy may be classified into electrically conductive loss, dielectric loss and magnetic loss. A quantity of conversion of the electromagnetic wave into the thermal energy may be presupposed based on these three sorts of loss. In this case, the energy of the electromagnetic wave absorbed by a unit volume $P[W/m^3]$ may be expressed, in terms of the electrical field E, a magnetic field H and the frequency f, by the following mathematical expression (1):

$$P = \frac{1}{2}\sigma|E|^2 + \pi f \varepsilon''|E|^2 + \pi f \mu''|H|^2 \quad (1)$$

where
electrical conductivity: $\sigma$
complex dielectric constant: $\varepsilon = \varepsilon' - j\varepsilon''$
complex permeability: $\mu = \mu' - j\mu''$ In the above equation (1), the first term, second term and the third term stand for the electrically conductive loss, dielectric loss and the magnetic loss, respectively, and both $j\varepsilon''$ and $j\mu''$ stand for delay components of the absorption of the electromagnetic wave.

At present, the electromagnetic wave suppressor is mainly used for an electronic device. In particular, the electromagnetic wave suppressor is used as it is stuck on a printed circuit board, an FPC (Flexible printed Circuit) or on an upper surface of a package. There has so far been developed a large variety of sorts of the magnetic sheet, such as the sheet containing a carbonaceous material, to say nothing of the sheet composed of a mixture of resin with ferrite or magnetic metal powders.

This electromagnetic wave suppressor is used as an absorber that absorbs an electromagnetic wave radiated from an antenna source or as a high harmonic filter suppressing that a high harmonic noise component superposes on a signal from e.g. an antenna source.

As the electromagnetic wave suppression material that suppresses an electromagnetic wave in a high frequency range, a magnetic material was prevalently used. With the magnetic sheet, formed of this magnetic material, the magnetic permeability $\mu t''$ of the third term of the equation (1) is set so as to be higher in order to absorb and suppress the electromagnetic wave.

Thus, among existing magnetic sheets, there is such a sheet in which the mixed quantity of magnetic powders is increased to elevate an absorption characteristic. In this case, the specific gravity of the magnetic sheet is increased with increase in the quantity of the magnetic powders to provide only a hard magnetic sheet which may not be appropriately bonded to e.g. the flexible printed board. Moreover, since the magnetic powders are used for the magnetic sheet, the sheet is costly. Hence, a need has been felt for a more inexpensive electromagnetic wave suppression sheet.

Thus, with attention focused on the dielectric constant of a liquid material having polarity or an ion-containing liquid material, such as an electrolytic solution, an electromagnetic wave suppression material having a high electromagnetic wave absorption efficiency has been developed for use in a high frequency range. Moreover, such an electromagnetic wave suppression material has also been developed which, through the use of a crosslinking structure, is able to remain in stabilized state against a set of changes in temperature.

Patent Publication 1 shows an electromagnetic wave suppression device as typical of the electromagnetic wave suppressor. The electromagnetic wave suppression device is composed of an electromagnetic wave suppression material sealed by a film adapted to prevent transpiration of a water-resistant vapor. The electromagnetic wave suppression material has been gelled by adding acrylamide as a resin component, methylenebisacrylamide as a curing agent, and ammonium sulfide as an initiator, to an electrolyte solution, such as sodium chloride. This electromagnetic wave suppression sheet, in which the electrolyte solution is kept in a state of a gel, has a high dielectric loss, up to a frequency range of 10 GHz, and hence exhibits the effect of suppressing unnecessary radiations of an electromagnetic wave in the high frequency range. This effect is referred to below as an electromagnetic wave suppression effect.

Patent Publication 1: Japanese Patent Publication Laid-Open No. 2006-73991

DISCLOSURE OF THE INVENTION

Problem to be solved by the Invention

Meanwhile, an electronic device is used in a low temperature environment, such as in a freezing chamber. If, in such case, the ambient temperature is below the freezing temperature of the gel as an electromagnetic wave absorber, the latter is frozen, such that its function of suppressing the electromagnetic wave cannot be displayed.

The electromagnetic wave suppression sheet, disclosed in Patent Publication 1, suffers a problem that, since the component of the aqueous solution becomes frozen at lower than a freezing point, and hence ice crystals are precipitated, the dielectric constant is lowered, such that the electromagnetic wave suppression effect may not be displayed.

An embodiment of the present invention has been proposed in view of the above-described status of the related technique, and provides an electromagnetic wave suppression material that is able to sufficiently demonstrate the effect of electromagnetic wave suppression even under a low temperature environment, and an electromagnetic wave suppression sheet in which has been sealed the electromagnetic wave suppression material.

To solve the above problem, an embodiment of the present invention provides an electromagnetic wave suppression material composed of an acrylate-based polymer gel containing an electrolyte and an alcohol.

To solve the above problem, an embodiment of the present invention also provides an electromagnetic wave suppression sheet having an electromagnetic wave suppression material of the present invention sealed in a moisture-resistant film.

With the electromagnetic wave suppression material and the electromagnetic wave suppression sheet, according to an embodiment of the present invention, the function of electromagnetic wave suppression may be in play in stability, even under a low temperature environment, as a result of depression of the freezing point of the acrylate-based polymer gel.

BEST MODE FOR CARRYING OUT THE INVENTION

A specified embodiment of the present invention is now described in detail with reference to the drawings.

Figure 1:
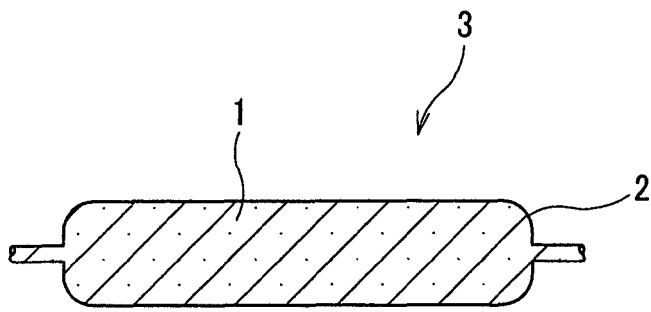
FIG. 1 is a cross-sectional view of an electromagnetic wave suppression sheet in an embodiment of the present invention.

FIG. 1 depicts a cross-sectional view of an electromagnetic wave suppression sheet 3 sealed in a moisture-resistant film 2. The electromagnetic wave suppression material 1 is formed of a gel compound whose electromagnetic wave suppression function may be maintained in stability even under a low temperature environment as a result of depression of the freezing point of the gel at which the gel freezes.

Specifically, the electromagnetic wave suppression material 1 is formed of an acrylate-based polymer gel containing an electrolyte and an alcohol. In forming this acrylate-based polymer gel, a polymerization initiator and a crosslinking agent are added to an acrylate monomer. This causes polymerization of the acrylate monomer to generate an acrylate based high molecular material having a crosslinking structure. This acrylate based high molecular material then absorbs the electrolyte and the alcohol to yield the acrylate-based polymer gel.

The electromagnetic wave suppression sheet 3 is produced by the electromagnetic wave suppression material 1 being charged into the inside of a moisture-resistant film 2 having moisture-resistant properties, whose peripheral area is then laminated by a predetermined adhesive. Although the thickness of the electromagnetic wave suppression sheet 3 is preferably 0.05 to 3 mm, for example, such value is only illustrative and is not intended to restrict the invention.

Such a material that has a high value of the dielectric constant c" of the second term of the above equation (1), which stands for the dielectric constant, is able to efficiently absorb and suppress the electromagnetic wave in the high frequency range of the MHz and GHz ranges. A solution containing polar molecules or an electrolyte solution is useful as a material that elevates the electromagnetic wave absorption efficiency.

The electromagnetic wave suppression material 1 contains an electrolytic solution that induces freezing point depression of the solution and that elevates the loss factor (Loss) of the electromagnetic wave which is a measure of the effect of electromagnetic wave suppression and absorption in the high frequency range. The electromagnetic wave suppression material 1 also contains an alcohol which is a polar solvent exhibiting optimum compatibility with the electrolytic solution. The alcohol also acts as an antifreeze solution that induces the freezing point depression of the solution and that elevates the loss factor in the high frequency range.

An alcohol used according to the present embodiment may be enumerated by, for example, primary, secondary, ternary or higher order alcohols. Specified examples of the alcohols include methanol, ethanol, propanol, butanol, ethyleneglycol (EG), propylene glycol (PG) and pentaerythrytol. Of these, glycols, in particular ethyleneglycol, are most preferred from the perspective of demonstration of functions and interaction with other compounds.

The electrolytic solution of the present embodiment may be any suitable electrolytic solution of electrolytes that induce freezing point depression of the solution.

In light of the above, the electrolyte that an ion is maintained in stability without crystal precipitating even in some temperature change is desirable. Moreover, it is preferable to be strong electrolyte to completely dissociate to an ion in solutions. Examples of the electrolyte include sodium chloride, potassium chloride, calcium chloride and potassium acetate. Meanwhile, calcium acetate may be used with glycerin exhibiting water retention performance and diffusion performance to render it possible to maintain the function of suppressing the electromagnetic wave in a sustained fashion.

Figure 2:
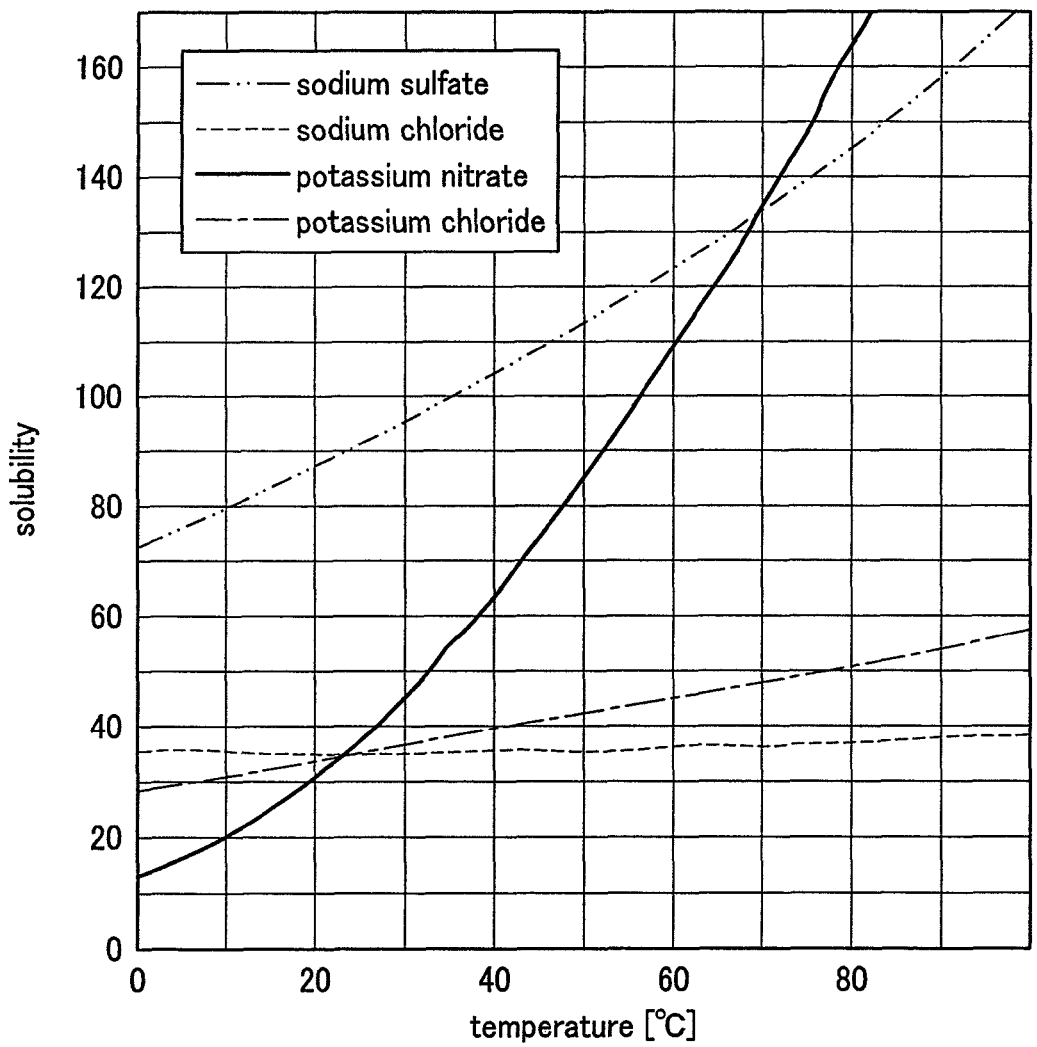
FIG. 2 is a graph showing solubility curves for sodium nitrate, potassium nitrate, potassium chloride and sodium chloride.

FIG. 2 shows solubility curves for sodium nitrate, potassium nitrate, potassium chloride and sodium chloride. With potassium chloride and sodium chloride, among these four compounds, the gradient of the solubility curves is moderate such that there is only little probability for crystal precipitation with only small temperature change. Hence, potassium chloride and sodium chloride are able to maintain ions in stability without crystal precipitation even with only small changes in temperature.

With the present embodiment, an acrylate-based polymer gel with a gel freezing point not higher than −20° C. may be produced by adjusting the amounts of addition of the electrolyte and the alcohol. In this manner, the electromagnetic wave suppression material 1 may demonstrate its electromagnetic wave suppressing function in stability without the gel becoming frozen even under a low temperature environment. Thus, in Japan, the electromagnetic wave suppression material may be used in any place, both indoors and outdoors, in any seasons of the year.

The acrylate based polymer gel that formulates the electromagnetic wave suppression material 1 has a three-dimensional network structure obtained on addition of a polymerization initiator and a crosslinking agent to an acrylate-based monomer. The acrylate based high molecular material may be polymerized from the acrylate monomer by the polymerization initiator initiating the chain reaction of the acrylate monomer. The crosslinking agent plays the role of crosslinking with respect to a portion of the side chain of the acrylate-based high molecular material. By this crosslinking, the acrylate-based high molecular material comes to have a three-dimensional network structure.

As the acrylate monomer, any of mono-functional acrylates, such as methyl acrylate, ethyl acrylate, aromatic acrylate or acrylamide, may be used. In particular, acrylamide is most preferred in light of interaction with the glycols and electrolytes.

As the crosslinking agents, di-functional, tri-functional or higher functional acrylates, for example, may be used. Of these, N,N'-alkylenebis acrylamide is preferred, and N,N'-methylenebisacrylamide, is most preferred in light of interaction with the alcohols and electrolytes. As regards the crosslinking method, such a method that uses thermal crosslinking and optical crosslinking in conjunction may be used.

As regards the polymerization initiator, a radical initiator, for example, may be used. In particular, an azo-based initiator or a peroxide based initiator is preferred. Of these, ammonium peroxodisulfate is most preferred in light of interaction with the alcohols and electrolytes.

If an acrylamide, as an acrylate monomer, N,N'-methylenebisacrylamide, as a crosslinking agent, a ammonium peroxodisulfate, as a polymerization initiator, an aqueous solution of sodium chloride, as an electrolyte solution, and ethyleneglycol, as a non-freezing solution, are used, acrylamide is polymerized by ammonium peroxodisulfate. At the same time, N,N'-methylenebisacrylamide, as the crosslinking agent, is bonded to a side chain of part of acrylamide to form a crosslink to generate a polyacrylamide having a three-dimensional network structure.

This polyacrylamide absorbs sodium chloride and ethyleneglycol to become swollen to yield a polyacrylamide gel.

The sodium chloride concentration [mol/L] is preferably 2 to 4 mol/L. If the sodium chloride concentration [mol/L] is not higher than 1 mol/L, the freezing point of the polyacrylamide gel is not below −20° C. If the sodium chloride concentration [mol/L] is not less than 5 mol/L, sodium chloride is precipitated at a stage when the electromagnetic wave suppression material has been set to not higher than 0° C., thus disabling the evaluation. In addition, the moisture-resistant film 2 may be fractured due to volumetric expansion caused by freezing.

Moreover, in this case, the amount of ethyleneglycol is preferably 10 to 35 parts by weight based on 100 parts by weight of the polyacrylamide gel. If the amount of ethyleneglycol is less than 10 parts by weight to 100 parts by weight of the polyacrylamide gel, the effect of the freezing point depression is only small. If the amount of ethyleneglycol exceeds 35 parts by weight with respect to 100 parts by weight of the polyacrylamide gel, the relative concentration of sodium chloride is lowered to deteriorate the noise suppression effect in the GHz range.

The electromagnetic wave suppression material 1 itself may be used in a sheet form. However, in this case, there is fear that shape retention of the sheet may not be assured due to fracture. For this reason, the electromagnetic wave suppression material 1 is preferably used as an electromagnetic wave suppression device, such as an electromagnetic wave suppression sheet, sealed in a moisture-resistant film, for assuring sufficient shape retention.

The moisture-resistant film 2 is a cellular film exhibiting moisture resistance and light transmission performance. As the moisture-resistant film 2 in the present embodiment, an ultra-moisture-resistant film 'CELLEL' (a trade name of a product manufactured by KUREHA CORPORATION), exhibiting high moisture resistance and high transparency, may be used. This film is referred to below as an ultra-moisture-resistant film 2a. The ultra-moisture-resistant film 2a is of such a structure in which a plurality of PET (polyethylene terephthalate) films, carrying thereon a moisture-resistant barrier layer, such as metal oxide layer, are laminated by a thermoplastic resin, and in which thermoplastic resin for encapsulation is formed on an outermost sealing surface.

The electromagnetic wave suppression sheet 3, composed of the electromagnetic wave suppression material 1, sealed by the moisture-resistant film 2, is able to maintain its electromagnetic wave suppression function in stability even under a low temperature condition. Moreover, the electromagnetic wave suppression sheet is flexible and hence may be bonded to a structure of an intricate shape, such as a flexible printed circuit.

EXAMPLE

An Example of the present invention is now described. It is observed that the present Example may be modified in many ways without departing from the purport of the invention.

<Preparation of Electromagnetic Wave Suppression Sheet 3>

The method for fabrication of the electromagnetic wave suppression sheet 3, containing the electromagnetic wave suppression material 1, sealed within the moisture-resistant film 2, is now described.

To pure water (68.62 g) were added sodium chloride (8.01 g, manufactured by KANTO CHEMICAL CO. INC.), ethyleneglycol (17.16 g, manufactured by KANTO CHEMICAL CO. INC.), acrylamide (6.10 g, manufactured by WAKO PURE CHEMICAL INDUSTRIES, LTD.) and N,N'-methylenebisacrylamide (0.07 g, manufactured by WAKO PURE CHEMICAL INDUSTRIES, LTD.). The resulting mass was stirred by a stirrer until the compounds were dissolved completely. The resulting solution was added by ammonium peroxodisulfate (0.04 g, manufactured by WAKO PURE CHEMICAL INDUSTRIES, LTD.) as polymerization initiator. The resulting mass was sufficiently stirred in a stirrer until ammonium peroxodisulfate was dissolved completely.

As a result, the concentration of the mixed solution was 2.0 mol/L of sodium chloride, 20 wt % of ethyleneglycol, 1.0 mol/L of acrylamide, 0.5 mol/L of N,N'-methylenebisacrylamide and 0.2 mol % of peroxo ammomium disulfate.

The stirred mixed solution was charged into a vacuum oven, depressurized at ambient temperature, and oxygen in the mixed solution was extracted by way of a degassing operation.

The ultra moisture-resistant film 2a was cut to a plurality of predetermined size pieces. Two of these pieces were placed facing each other with their sealing surfaces which are thermoplastic resin forming surfaces, and the three sides except a injecting opening for solution, were laminated together, using an impact sealer, to form a cellular ultra moisture-resistant film 2a.

The ultra moisture-resistant film 2a was introduced into a thickness retention jig, made up of a glass substrate and a spacer of an aluminum sheet that had a thickness sufficient for the electromagnetic wave suppression sheet 3. The mixed solution was then poured and charged into the inside of the moisture-resistant film 2a. As an excess overflowing portion of the mixed solution was extruded by the impact sealer, the injection opening of the ultra moisture-resistant film 2a was closed to form the electromagnetic wave suppression sheet 3.

The sheet charged with the mixed solution was clamped by the thickness retention jig, and the resulting assembly was charged into an oven set at 60° C. The reaction of polymerization and crosslinking of the acrylamide was carried out in the sheet material to formulate a polyacrylamide gel. This completes an electromagnetic wave suppression sheet 3. The electromagnetic wave suppression sheet 3, in which the electromagnetic wave suppression material 1 was held sealed, was taken out of the oven.

<Measurement of Freezing Point Depression of the Electromagnetic Wave Suppression Material 1>

16 kinds of electromagnetic wave suppression sheets 3 (samples 1 to 16) were fabricated, as the concentration of sodium chloride [mol/L] and that of ethyleneglycol [wt. %] were varied, and measurement was made of the freezing points of the samples. The following Table 1 shows the values of the concentration of sodium chloride [mol/L], those of ethyleneglycol [wt. %] and the freezing point [° C.] of the samples 1 to 16.

| | Concentration of NaCl (mol/L) | EC concentration (wt %) | Freezing point (° C.) |
|---|---|---|---|
| Sample 1 | 1.0 | 10 | −7.5 |
| Sample 2 | 1.0 | 15 | −12.0 |
| Sample 3 | 1.0 | 20 | −15.0 |
| Sample 4 | 1.0 | 25 | −18.0 |
| Sample 5 | 2.0 | 10 | −12.5 |
| Sample 6 | 2.0 | 15 | −17.5 |
| Sample 7 | 2.0 | 20 | −21.5 |
| Sample 8 | 2.0 | 25 | −25.0 |
| Sample 9 | 3.0 | 10 | −19.0 |
| Sample 10 | 3.0 | 15 | −22.5 |
| Sample 11 | 3.0 | 20 | −26.0 |
| Sample 12 | 3.0 | 25 | −31.0 |
| Sample 13 | 4.0 | 10 | −26.5 |
| Sample 14 | 4.0 | 15 | −30.0 |
| Sample 15 | 4.0 | 20 | −37.5 |
| Sample 16 | 4.0 | 25 | −44.0 |

Figure 3:
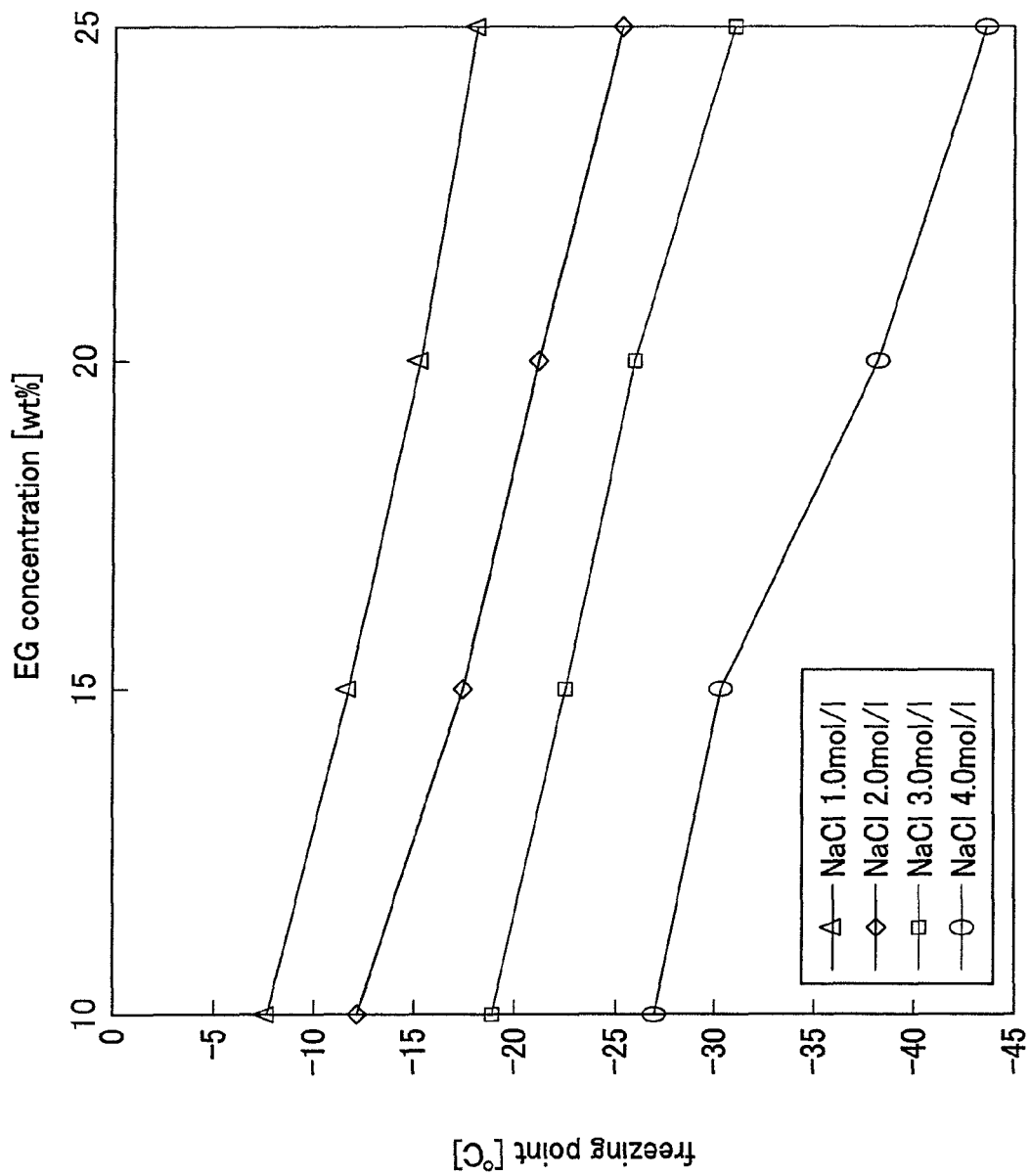
FIG. 3 is a graph showing the relationship between the concentration of ethyleneglycol [%] and the freezing point [° C.] for values of concentration of sodium chloride of 1.0 mol L, 2.0 mol/L, 3.0 mol/L and 4.0 mol/L.

FIG. 3 shows the relationship between the concentration of ethyleneglycol [wt. %] and the freezing point [° C.], for the concentrations of sodium chloride of 1.0 mol/L, 2.0 mol/L, 3.0 mol/L and 4.0 mol/L, based on the values shown in Table 1.

Referring to FIG. 3, the freezing point of polycrylamide gel was lowered with rise in the concentration of sodium chloride. The freezing point of polycrylamide gel was also lowered with rise in the concentration of ethyleneglycol [wt. %].

As may be seen from FIG. 3, with the concentration of sodium chloride of 1.0 mol/L, the freezing point of the polyacrylamide gel was not lowered to below −20° C. for any of the values of the concentration of ethyleneglycol ranging between 10 and 25 wt %.

<Evaluation of the Electromagnetic Wave Suppression Effect of the Electromagnetic Wave Suppression Sheet 3>

An evaluation was made of the electromagnetic wave suppression effect in the electromagnetic wave suppression sheet 3 with a thickness of 1 mm. In this electromagnetic wave suppression sheet, manufactured by the above manufacturing method, as the sodium chloride concentration [mol/L] and the concentration of ethyleneglycol [wt. %] were varied, there was contained sealed the electromagnetic wave suppression material 1.

In the present Example, measurement was made of the loss factor [%] of the electromagnetic wave, as a measure of the effect in suppressing and absorbing the electromagnetic wave, using a micro-strip line.

Figure 4B:
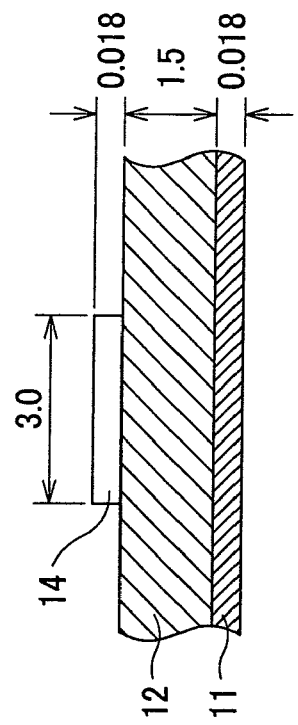
FIGS. 4A and 4B show a setup for measuring the loss factor of the electromagnetic wave at higher harmonics.
Figure 4A:
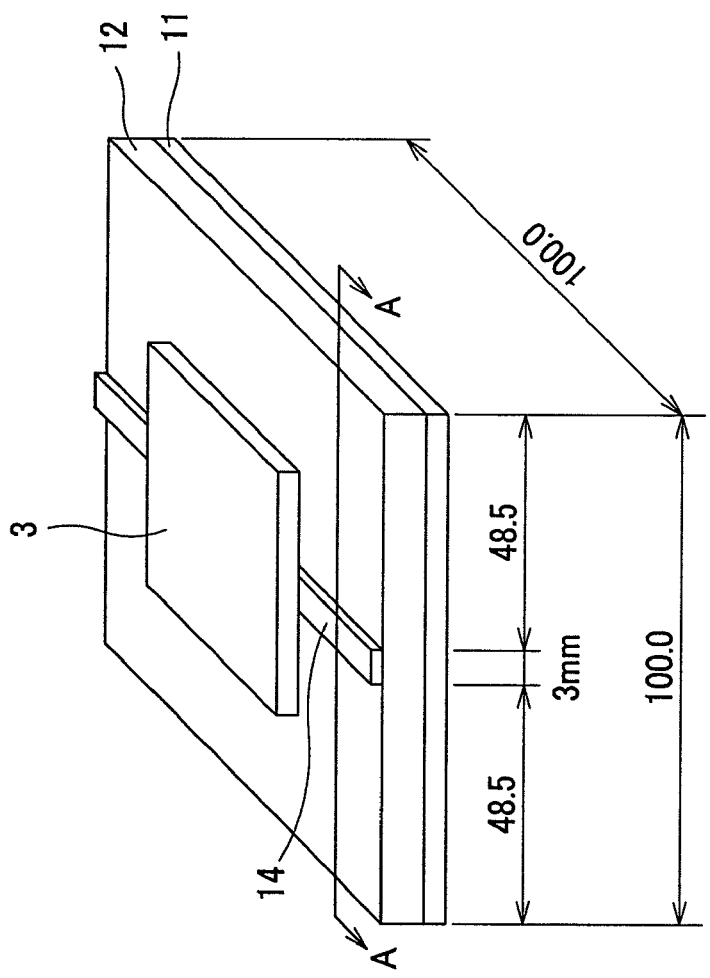
Figure 5:
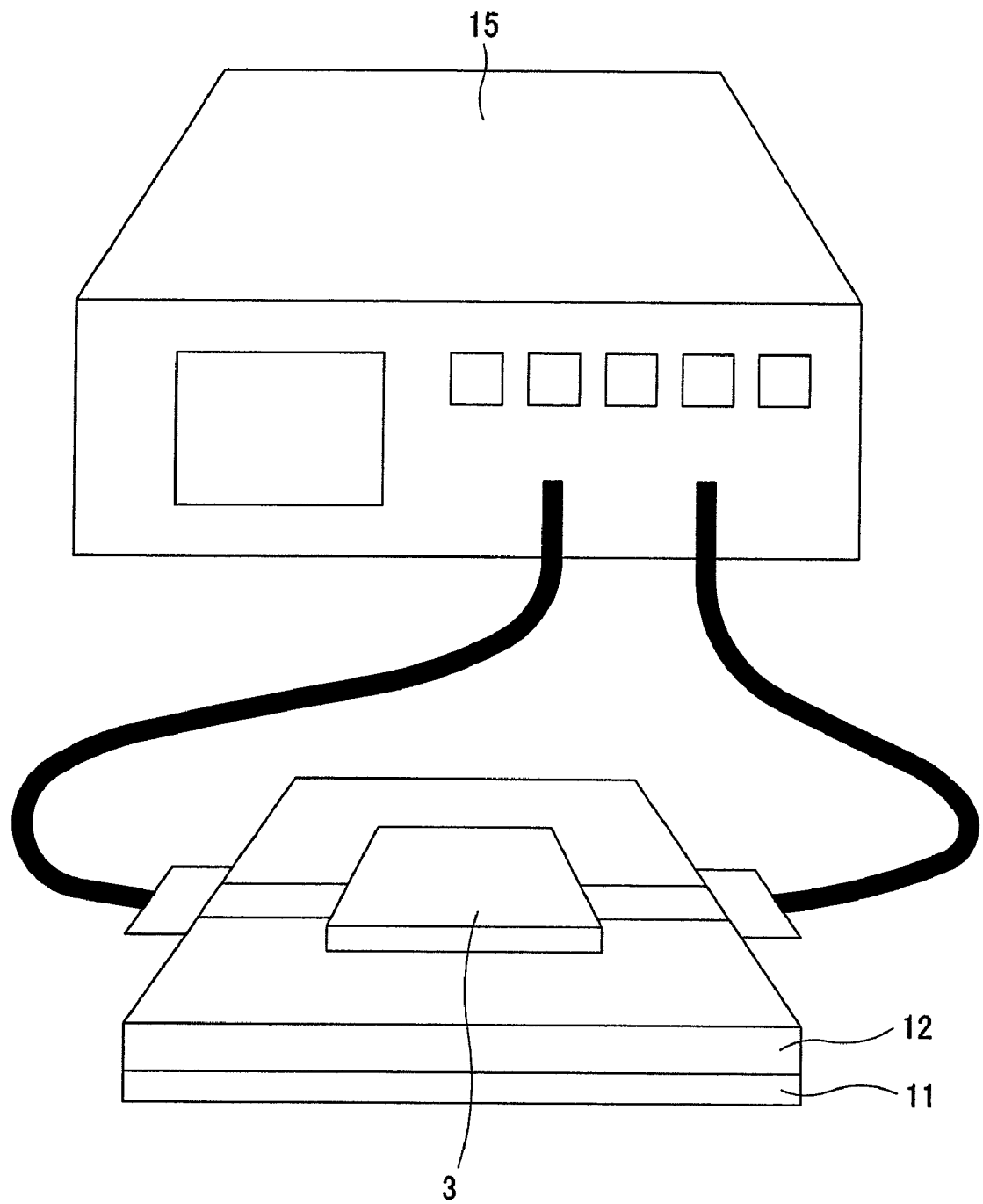
FIG. 5 shows a setup for a network analyzer.
Figure 6:
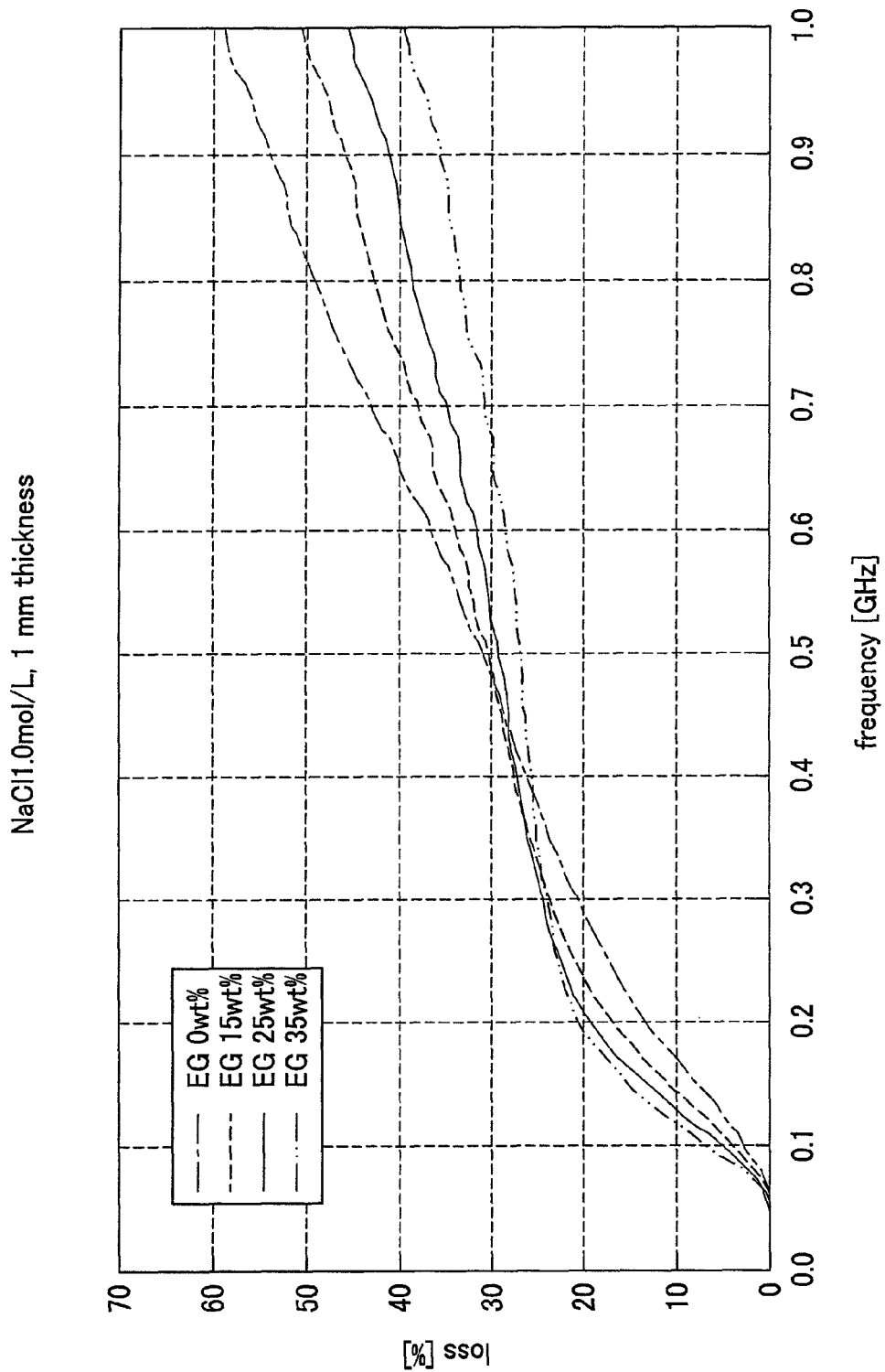
FIG. 6 is a graph showing the frequency change of the loss factor [%] of an electromagnetic wave suppression material manufactured with the concentration of sodium chloride of 1.0 mol/L.
Figure 7:
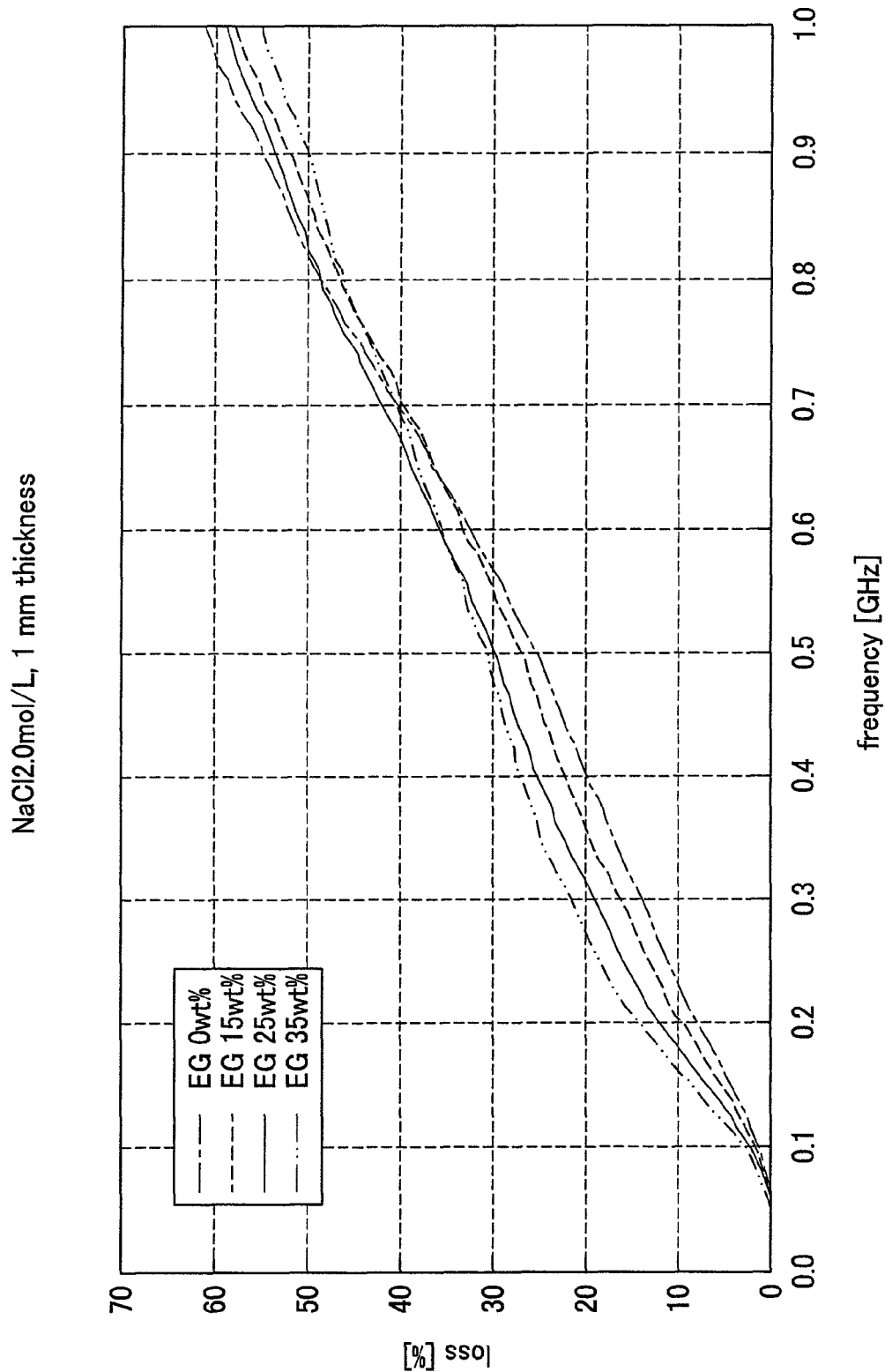
FIG. 7 is a graph showing the frequency change of the loss factor [%] of an electromagnetic wave suppression material manufactured with the concentration of sodium chloride of 2.0 mol/L.
Figure 8:
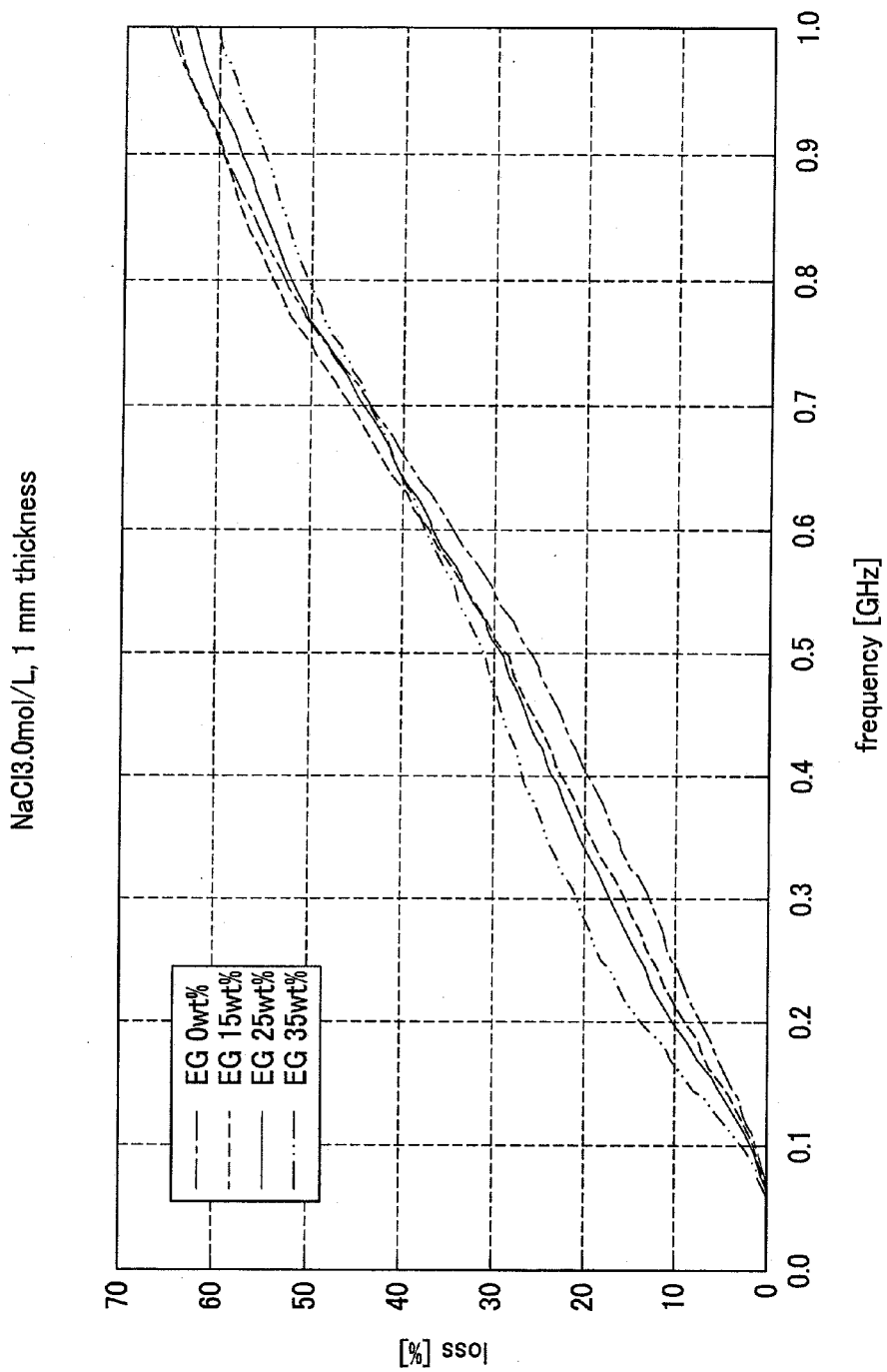
FIG. 8 is a graph showing the frequency change of the loss factor [%] of an electromagnetic wave suppression material manufactured with the concentration of sodium chloride of 3.0 mol/L.
Figure 9:
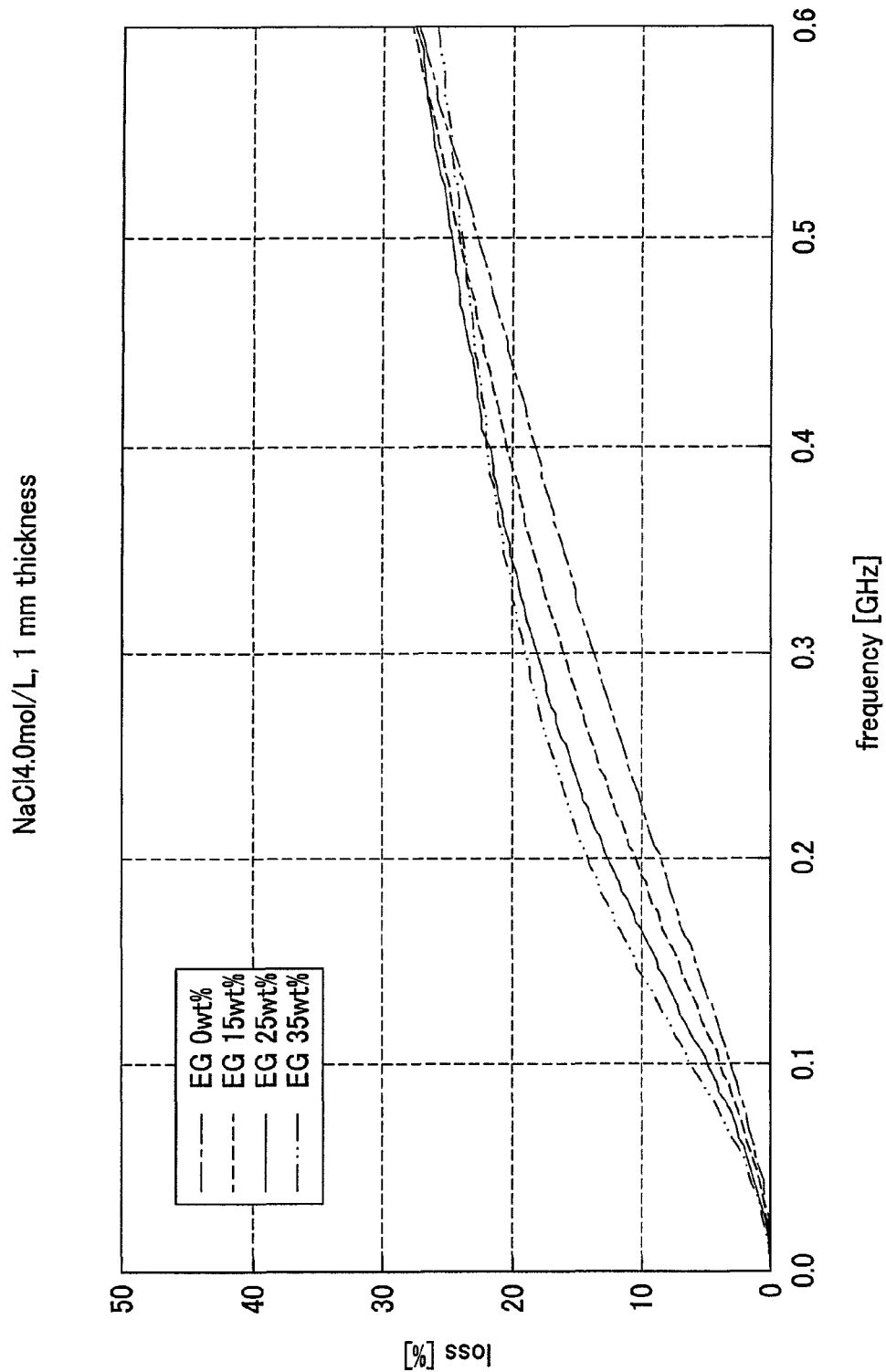
FIG. 9 is a graph showing the frequency change of the loss factor [%] of an electromagnetic wave suppression material manufactured with the concentration of sodium chloride of 4.0 mol/L.

In the present Example, measurement was made of the loss factor [%] of the electromagnetic wave using a setup shown in FIGS. 4A and 4B. Referring to FIG. 4A, a micro-strip line 14 was formed on a substrate 12 whose reverse surface carried an electrically conductive layer 11 kept at the ground potential. On this micro-strip line 14 was mounted the electromagnetic wave suppression sheet 3. FIG. 4B depicts an enlarged cross-sectional view taken on a line A-A of FIG. 4A. The substrate 12 was of a dielectric constant ∈r of 4.1 and a size of length×width×thickness of 100.0 mm×100.0 mm×1.5 mm. The electrically conductive layer 11 was of a film thickness of 0.018 mm. The micro-strip line 14 was of a size of width×length of 3 mm×100.0 mm. A signal was made to be incident from the input side to the output side of the micro-strip line to measure reflection and transmission characteristics. For measurement, a network analyzer 15 shown in FIG. 5 was used. From measured results of signal characteristics in the presence and absence of the electromagnetic wave suppression sheet 3 at this time, evaluation was made of the harmonics filtering (shielding) effect of the electromagnetic wave suppression sheet 3. The shape of the electromagnetic wave suppression sheet 3 was 50.0 mm×30.0 mm×0.5 mm.

FIGS. 6 to 9 show loss characteristics indicating the loss of light absorbed by a plurality of electromagnetic wave suppression sheets 3 having respective different conditions. In each of these figures, the ordinate and the abscissa denote the loss factor (Loss) [%] and the frequency [GHz], respectively. The signal quantity on the input side less the amount of reflection and that of transmission represents the loss. The larger the amount of the loss, the greater are the effects of suppression and absorption of the electromagnetic wave.

With the reflection characteristic of S11 and the transmission characteristic of S21, the loss factor [%] may be calculated by the following equation (2):

$$\text{loss factor } [\%] = 100 \times \left(1 - 10^{\frac{S_{11}}{10}} - 10^{\frac{S_{21}}{10}}\right) \quad (2)$$

That is, FIGS. 6 to 9 show changes with frequency of the loss factor [%] of the electromagnetic wave suppression sheet 3 (1 mm in thickness) for the ethyleneglycol concentration of 0 wt %, 15 wt %, 25 wt % and 35 wt %. The electromagnetic wave suppression sheet 3, in which was held sealed the electromagnetic wave suppression material 1, was manufactured by the above manufacturing method with the concentrations of sodium chloride of 1.0 mol/L, 2.0 mol/L, 3.0 mol/L and 4.0 mol/L.

It is seen from FIGS. 6 to 9 that, with the concentrations of sodium chloride of 1.0 mol/L, 2.0 mol/L, 3.0 mol/L and 4.0 mol/L, the loss factor [%] increases with increase in the concentration of ethyleneglycol [wt %] for respective predetermined frequency (GHz) ranges.

It is thus seen that, in the present Example, the electromagnetic wave suppression sheet 3, composed of the electromagnetic wave suppression material 1 sealed in the moisture-resistant film 2, exhibits the function of electromagnetic wave suppression in a predetermined frequency range in stability even under a low temperature condition not higher than $-20°$ C.

It should be noted that the present invention is not limited to the above-described embodiments. That is, the present invention may encompass various modifications or corrections that may occur to those skilled within the gamut of the entire disclosure of the present invention.

The invention claimed is:

1. An electromagnetic wave suppression material comprising:
    an acrylate-based polymer gel containing an electrolyte and an alcohol, wherein said acrylate-based polymer gel is a polyacrylamide gel polymerized from acrylamide and
    N,N'-methylenebisacrylamide, and wherein
        said polyacrylamide contains 2 to 4 mol/L of sodium chloride as said electrolyte and also contains 10 to 35 parts by weight of ethyleneglycol based on 100 parts by weight of said polyacrylamide, as said alcohol, with the freezing point of said polyacrlamide being not higher than $-20°$ C.

2. The electromagnetic wave suppression material according to claim 1 wherein
    said acrylate-based polymer gel is a polyacrylamide gel polymerized from acrylamide and
    N,N'-methylenebisacrylamide, and wherein
        said polyacrylamide gel contains 2 mol/L of sodium chloride as said electrolyte and also contains 20 to 35 parts by weight of ethyleneglycol based on 100 parts by weight of said polyacrylamide, as said alcohol.

3. The electromagnetic wave suppression material according to claim 2 wherein, with the frequency of 0.1 to 0.5 GHz, the loss factor of the electromagnetic wave increases with increase in the content of ethyleneglycol.

4. The electromagnetic wave suppression material according to claim 1 wherein
    said acrylate-based polymer gel is a polyacrylamide gel polymerized from acrylamide and
    N,N'-methylenebisacrylamide, and wherein
        said polyacrylamide gel contains 3 mol/L of sodium chloride as said electrolyte and also contains 15 to 35 parts by weight of ethyleneglycol, based on 100 parts by weight of said polyacrylamide, as said alcohol.

5. The electromagnetic wave suppression material according to claim 4 wherein, with the frequency of 0.1 to 0.5 GHz, the loss factor of the electromagnetic wave increases with increase in the content of ethyleneglycol.

6. The electromagnetic wave suppression material according to claim 1 wherein
    said acrylate-based polymer gel is a polyacrylamide gel polymerized from acrylamide and
    N,N'-methylenebisacrylamide, and wherein
        said polyacrylamide gel contains 4 mol/L of sodium chloride as said electrolyte and also contains 10 to 35 parts by weight of ethyleneglycol based on 100 parts by weight of said polyacrylamide, as said alcohol.

7. The electromagnetic wave suppression material according to claim 6 wherein, with the frequency of 0.1 to 0.4 GHz, the loss factor of the electromagnetic wave increases with increase in the content of ethyleneglycol.

8. An electromagnetic wave suppression sheet having an electromagnetic wave suppression material according to claim 1 sealed in a moisture-resistant film.

9. An electromagnetic wave suppression sheet having an electromagnetic wave suppression material according to claim 2 sealed in a moisture-resistant film.

10. An electromagnetic wave suppression sheet having an electromagnetic wave suppression material according to claim 3 sealed in a moisture-resistant film.

11. An electromagnetic wave suppression sheet having an electromagnetic wave suppression material according to claim 4 sealed in a moisture-resistant film.

12. An electromagnetic wave suppression sheet having an electromagnetic wave suppression material according to claim 5 sealed in a moisture-resistant film.

13. An electromagnetic wave suppression sheet having an electromagnetic wave suppression material according to claim 6 sealed in a moisture-resistant film.

14. An electromagnetic wave suppression sheet having an electromagnetic wave suppression material according to claim 7 sealed in a moisture-resistant film.

15. An electromagnetic wave suppression material comprising:
    an acrylate-based polymer gel comprising an electrolyte and an alcohol, wherein the freezing point of said acrylate-based polymer gel is not higher than $-7.5°$ C.;
    wherein said acrylate-based polymer gel is a polyacrylamide gel polymerized from acrylamide and N,N'-methylenebisacrylamide, and wherein said polyacrylamide gel contains 1 to 4 mol/L of sodium chloride as said electrolyte and also contains 10 to 35 parts by weight of ethyleneglycol based on 100 parts by weight of said polyacrylamide, as said alcohol.

* * * * *